(12) United States Patent
Kothari et al.

(10) Patent No.: US 11,756,860 B2
(45) Date of Patent: Sep. 12, 2023

(54) SEMICONDUCTOR DEVICE STACK-UP WITH BULK SUBSTRATE MATERIAL TO MITIGATE HOT SPOTS

(71) Applicant: Intel Corporation, Santa Clara, CA (US)

(72) Inventors: Shrenik Kothari, Phoenix, AZ (US); Chandra Mohan Jha, Tempe, AZ (US); Weihua Tang, Chandler, AZ (US); Robert Sankman, Phoenix, AZ (US); Xavier Brun, Chandler, AZ (US); Pooya Tadayon, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 900 days.

(21) Appl. No.: 16/522,443

(22) Filed: Jul. 25, 2019

(65) Prior Publication Data

US 2021/0028087 A1 Jan. 28, 2021

(51) Int. Cl.
*H01L 23/42* (2006.01)
*H01L 23/522* (2006.01)
*H01L 23/373* (2006.01)
*H01L 23/367* (2006.01)
*H01L 25/07* (2006.01)
*H01L 23/538* (2006.01)

(52) U.S. Cl.
CPC ............ *H01L 23/42* (2013.01); *H01L 23/367* (2013.01); *H01L 23/3738* (2013.01); *H01L 23/522* (2013.01); *H01L 23/5384* (2013.01); *H01L 25/072* (2013.01)

(58) Field of Classification Search
CPC ... H01L 23/42; H01L 23/367; H01L 23/3738; H01L 23/522; H01L 23/36; H01L 23/3675; H01L 23/3731; H01L 23/433; H01L 23/5384; H01L 25/072
See application file for complete search history.

(56) References Cited

U.S. PATENT DOCUMENTS

| 2005/0070048 A1* | 3/2005 | Tolchinsky ......... H01L 23/3735 257/E23.09 |
| 2009/0079062 A1* | 3/2009 | Koide ................. H01L 23/3733 257/E23.101 |
| 2014/0182823 A1* | 7/2014 | Cumberland ......... H01L 23/373 428/221 |
| 2016/0172285 A1* | 6/2016 | Yang .................... H01L 25/072 257/675 |

* cited by examiner

*Primary Examiner* — Patricia D Valenzuela
(74) *Attorney, Agent, or Firm* — Schwabe, Williamson & Wyatt, P.C.

(57) ABSTRACT

Embodiments disclosed herein include semiconductor dies and methods of forming such dies. In an embodiment, the semiconductor die comprises a semiconductor substrate, an active device layer in the semiconductor substrate, where the active device layer comprises one or more transistors, an interconnect layer over a first surface of the active device layer, a first bonding layer over a surface of the semiconductor substrate, a second bonding layer secured to the first bonding layer, and a heat spreader attached to the second bonding layer.

25 Claims, 9 Drawing Sheets

SEMICONDUCTOR DEVICE STACK-UP WITH BULK SUBSTRATE MATERIAL TO MITIGATE HOT SPOTS

TECHNICAL FIELD

Embodiments of the present disclosure relate to semiconductor devices, and more particularly to semiconductor dies that include an integrated heat spreader.

BACKGROUND

Due to local temperature hot spots around transistor devices, silicon substrates run at high thermal reliability and throttling risks. For example, low core count high single thread frequency products exhibit significant temperature rise in the product use condition, leading to thermal design power (TDP) capping. Additionally, when the semiconductor die is overclocked, local temperatures may reach the reliability limit. Furthermore, thermal conditions are extreme during testing conditions that exceed the expected use case, which results in further stresses on the device. The present mitigation procedure involves reduction of $I_{CC}$ which reduces the total power. This leads to lower frequency specifications and reduced overclocking performance. Other solutions involve employing complicated and cost intensive package technologies and thermal solutions.

EMBODIMENTS OF THE PRESENT DISCLOSURE

Described herein are semiconductor dies with integrated heat spreaders and methods of forming such semiconductor dies, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, thermal hotspots on the semiconductor die result in decreased performance. One reason for the hotspots is that silicon has a relatively high thermal resistance. Accordingly, heat is not adequately spread until it passes through a thermal interface material to the heat spreader. As such, embodiments disclosed herein include semiconductor dies that include an integrated heat spreader that is bonded to the semiconductor substrate. In an embodiment, the bulk of the semiconductor substrate is removed and replaced with a heat spreader. The heat spreader has a thermal resistance that is lower than the semiconductor substrate. This allows for the heat to be more quickly spread to dissipate hotspots.

Figure 1A:
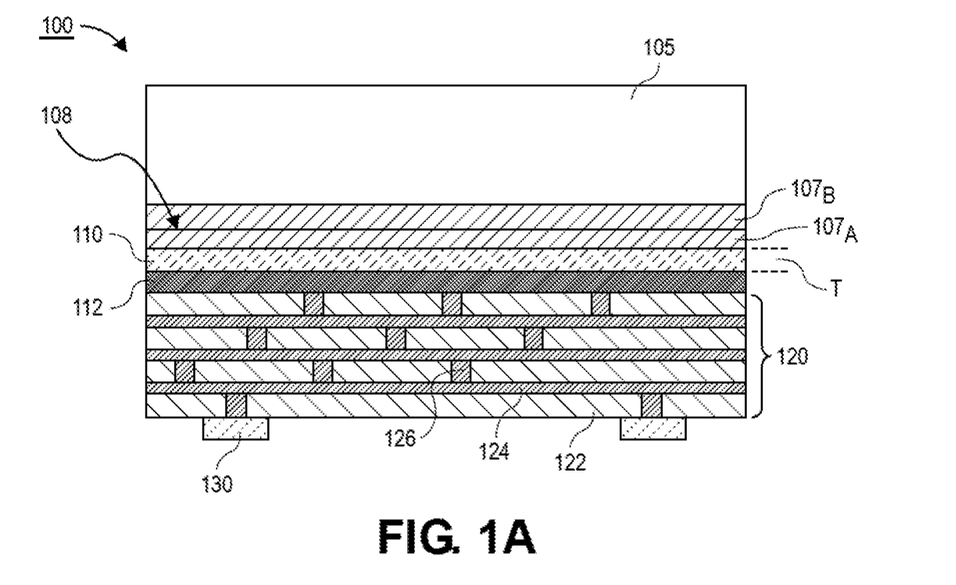
FIG. 1A is a cross-sectional illustration of a semiconductor die that includes an integrated heat spreader, in accordance with an embodiment.

Referring now to FIG. 1A, a cross-sectional illustration of a semiconductor die 100 is shown, in accordance with an embodiment. In an embodiment, the semiconductor die 100 may comprise a semiconductor substrate 110. The semiconductor substrate 110 may comprise any suitable semiconductor material. In an embodiment, the semiconductor substrate 110 represents a general workpiece object used to manufacture integrated circuits. The semiconductor substrate 110 often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials, such as substrates including germanium, carbon, or group III-V materials.

In an embodiment, the semiconductor substrate 110 may comprise and active device layer 112. The active device layer 112 may comprise one or more transistors or other active (or passive) devices. In FIG. 1A the individual transistors are omitted for clarity in order to not obscure embodiments disclosed herein. While referred to as a single layer, the active device layer 112 may include any number of layers.

In an embodiment, first interconnect layers 120 may be disposed over a surface of the active device layer 112. The first interconnect layers 120 may include interlayer dielectric (ILD) layers 122, conductive traces 124, and conductive vias 126. The first interconnect layers 120 may provide electrical routing between the transistors of the active device layer 112 and bumps 130 (e.g., first level interconnects (FLIs)).

In an embodiment, as used throughout the present description, ILD material (e.g., ILD layer 122) is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by techniques, such as, for example, chemical vapor deposition (CVD), physical vapor deposition (PVD), or by other deposition methods.

In an embodiment, as is also used throughout the present description, conductive traces 124 and conductive vias 126 are composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, a heat spreader 105 may be attached to the semiconductor substrate 110. In an embodiment, the heat spreader 105 may be attached to the semiconductor substrate by a bonding layer 107. In some embodiments, the bonding layer 107 may comprise a first bonding layer $107_A$ that interfaces with a second bonding layer $107_B$. For example, the interface between the first bonding layer $107_A$ and the second bonding layer $107_B$ may be characterized by a seam 108 that extends along the length of the interface. In some embodiments, the seam 108 may be detectible even when the first bonding layer $107_A$ and the second bonding layer $107_B$ comprise substantially the same material. That is, the seam 108 may be the result of a bonding process such as oxide bonding or nitride bonding, as will be described in greater detail below.

In an embodiment, the first bonding layer $107_A$ may be separated from the active device layer 112 by a portion of the semiconductor substrate 110. In order to provide improved thermal spreading, the thickness of the residual semiconductor substrate 110 may be minimized. For example, the portion of the semiconductor substrate 110 separating the active device layer 112 from the first bonding layer $107_A$ may have a thickness T that is less than approximately 10 μm. In some embodiments, the thickness T may be approximately 5 μm or less. However, it is to be appreciated that the thickness T may be any value. For example, the thickness T may be approximately 100 μm or greater in some embodiments.

In an embodiment, the first bonding layer $107_A$ and the second bonding layer $107_B$ may comprise any suitable materials that facilitate substrate to substrate bonding. For example, the first bonding layer $107_A$ and the second bonding layer $107_B$ may comprise an oxide or a nitride. In a particular embodiment, the first bonding layer $107_A$ and the second bonding layer $107_B$ may comprise an oxide of silicon (e.g., silicon dioxide ($SiO_2$) or a nitride of silicon (e.g., silicon nitride (SiN) or silicon carbon nitride (SiCN). Since the bonding layers $107_A$ and $107_B$ comprise materials with relatively low thermal conductivities, minimizing thickness of the first and second bonding layers $107_A$ and $107_B$ improves thermal performance of the semiconductor die 100. Accordingly, in an embodiment the first bonding layer $107_A$ and the second bonding layer $107_B$ may have a combined thickness that is less than approximately 5 μm. In other embodiments, the first bonding layer $107_A$ and the second bonding layer $107_B$ may have a combined thickness that is approximately 3 μm or less.

In an embodiment the second bonding layer $107_B$ may be directly attached to a heat spreader 105. The heat spreader 105 may have a thermal conductivity that is greater than a thermal conductivity of the semiconductor substrate 110 in order to provide improved thermal spreading to mitigate non-uniform heating of the semiconductor substrate 110. Additionally, the heat spreader 105 may have a coefficient of thermal expansion (CTE) that closely matches the CTE of the semiconductor substrate 110 in order to minimize stresses in the system. In an embodiment, the heat spreader 105 may comprise one or more of silicon and carbon (e.g., silicon carbide (SiC)), boron and arsenic (e.g., boron arsenide (BAs)), boron and phosphorous (e.g., boron phosphide (BP)), boron and nitrogen (e.g., boron nitride (BN)), and beryllium and oxygen (e.g., beryllium oxide (BeO)). In an embodiment, the heat spreader 105 may be polycrystalline or single crystalline. For example, the heat spreader 105 may have a thermal conductivity that is between two times and five times greater than a thermal conductivity of the semiconductor substrate 110. For example, silicon has a thermal conductivity between approximately 100 W/mK and 150 W/mK and silicon carbide has a thermal conductivity between approximately 300 W/mK and 500 W/mK. In an embodiment, the thickness of the heat spreader 105 may be chosen to match final stack requirements (i.e., matching chip heights in a multi-chip package (MCP)) or the like.

Figure 1B:
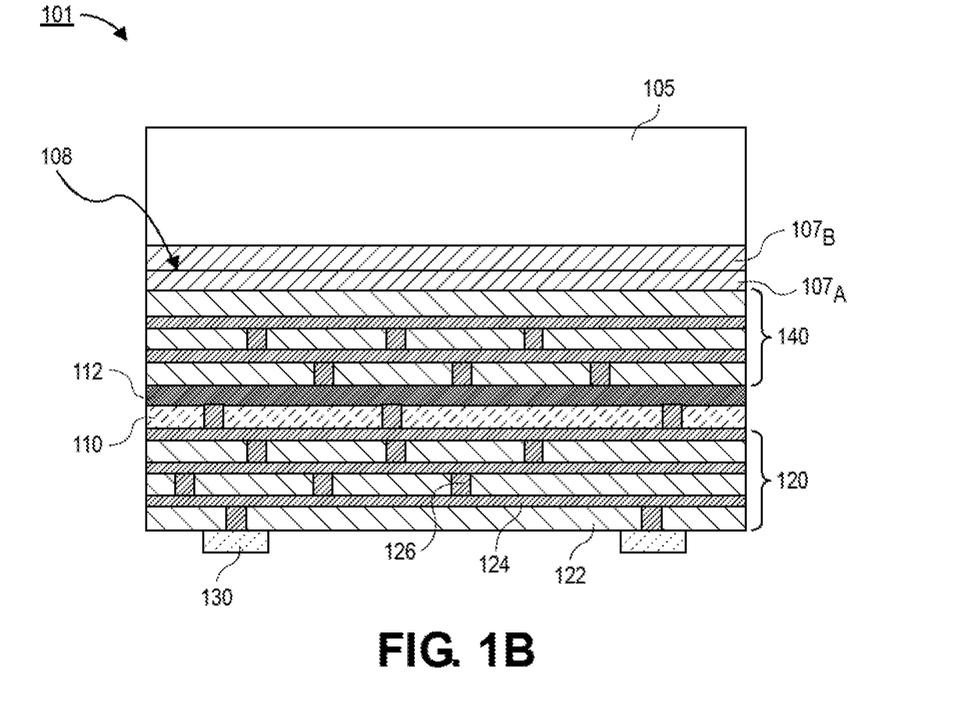
FIG. 1B is a cross-sectional illustration of a semiconductor die that includes an integrated heat spreader and interconnect layers over opposing surfaces of the active device layer, in accordance with an embodiment.

Referring now to FIG. 1B, a cross-sectional illustration of a semiconductor die 101 is shown, in accordance with an additional embodiment. In an embodiment, the semiconductor die 101 is substantially similar to the semiconductor die 100 in FIG. 1A, with the exception that second interconnect layers 140 are positioned between the active device layer 112 and the first bonding layer $107_A$. The inclusion of second interconnect layer 140 on the opposite side of the active device layer 112 allows for additional routing to interconnect regions of the active device layer 112. In such an embodiment, the first bonding layer $107_A$ may be attached to an ILD layer 122. That is, the first bonding layer $107_A$ may not be in direct contact with the semiconductor substrate 110, as is the case in the semiconductor die 100 shown in FIG. 1A.

Figure 2:
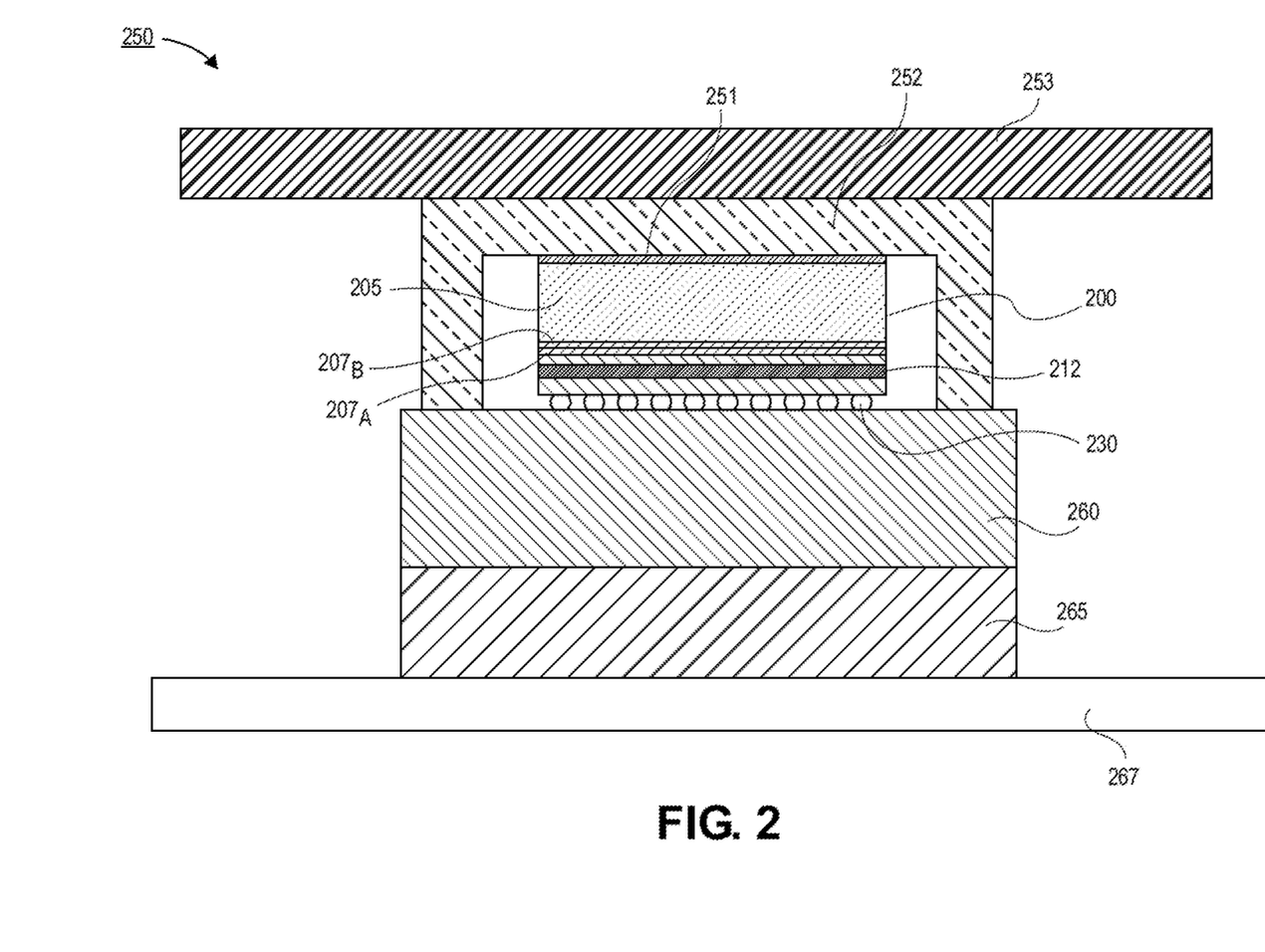
FIG. 2 is a cross-sectional illustration of an electronic system that comprises a packaged semiconductor die with an integrated heat spreader, in accordance with an embodiment.

Referring now to FIG. 2, a cross-sectional illustration of an electronic system 250 is shown, in accordance with an embodiment. In an embodiment, the electronic system 250 may comprise a semiconductor die 200. The semiconductor die 200 may be substantially similar to the semiconductor die 100 in FIG. 1A or the semiconductor die 101 in FIG. 1B. For example, the semiconductor die 200 may comprise an active device layer 212 that is thermally coupled to a first heat spreader 205 by bonding layers $207_A$ and $207_B$.

The semiconductor die 200 may be electrically coupled to a package substrate 260 by bumps 230 (e.g., FLIs). In an embodiment, the package substrate 260 may comprise a plurality of dielectric layers and conductive traces, vias, and the like. In some embodiments, the package substrate 260 may comprise passive components, embedded interposers, or any other components typically found in electronic packages.

In an embodiment, the package substrate 260 may be electrically coupled to a board 267, such as a printed circuit board (PCB) or the like. In the illustrated embodiment, the package substrate 260 is electrically coupled to the board 267 by a socket 265. However, it is to be appreciated that any suitable interconnect architecture may be used to electrically couple the package substrate 260 to the board 267, such as solder bumps, or the like.

In an embodiment, a second heat spreader 252 may be thermally coupled to the first heat spreader 205. The second heat spreader 252 may be thermally coupled to the first heat spreader 205 by a thermal interface material (TIM) 251. Typically TIMs have lower thermal conductivities than the second heat spreader 252. Accordingly, in semiconductor substrates that do not include a first heat spreader 205, such as those disclosed herein, the hot spots on the semiconductor die are not able to dissipate adequately due to the high thermal resistance. In contrast, embodiments disclosed herein that include a first heat spreader 205 allow for the spreading of the heat before the TIM 251 is encountered. As such, hot spots on the semiconductor die 200 can be adequately mitigated.

In an embodiment, the second heat spreader 252 may interface with a heat sink 253. The heat sink 253 may be any suitable thermal solution. For example, the heat sink 253 may comprise fins, or the like. In the illustrated embodiment, there is no interface material between the heat sink 253 and the second heat spreader 252. However, it is to be appreciated that in some embodiments a second TIM may be positioned between the heat sink 253 and the second heat spreader 252. In other embodiments, the second heat spreader 252 may be omitted. That is, the first heat spreader 205 may interface with the heat sink 253.

Referring now to FIGS. 3A-3F, a series of cross-sectional illustrations depicting a process for forming a semiconductor die 300 is shown, in accordance with an embodiment. In the illustrated embodiment, a single die 300 is illustrated. However, it is to be appreciated that the die 300 may be one die 300 in a wafer that comprises a plurality of dies 300 that are fabricated substantially in parallel.

Figure 3A:
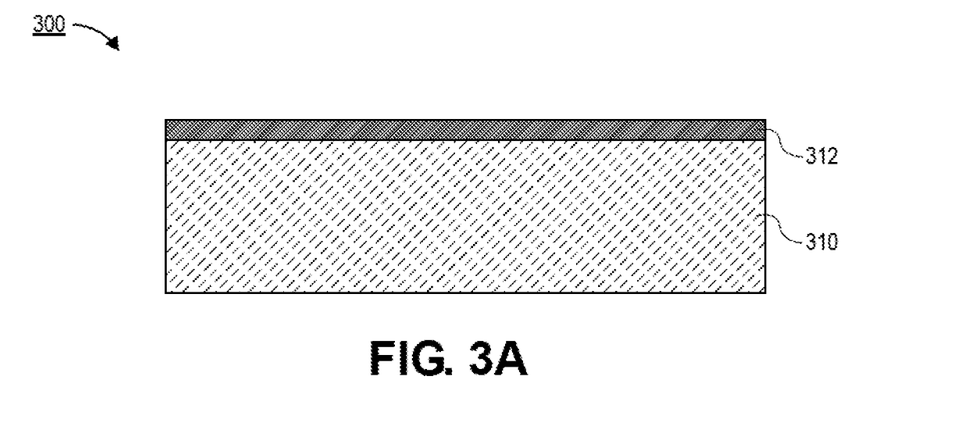
FIG. 3A is a cross-sectional illustration of a semiconductor die that comprises an active device layer, in accordance with an embodiment.

Referring now to FIG. 3A, a cross-sectional illustration of a semiconductor die 300 is shown, in accordance with an embodiment. In an embodiment, an active device layer 312 may be fabricated into the semiconductor substrate 310. In an embodiment, the active device layer 312 may comprise transistors or other active (or passive) components. For example, the active device layer 312 may include transistors for a processor die, a graphics processing die, a memory die, or any other type of die. The active device layer 312 may be fabricated with typical semiconductor fabrication processes, such as lithography, etching, doping, or the like.

Figure 3B:
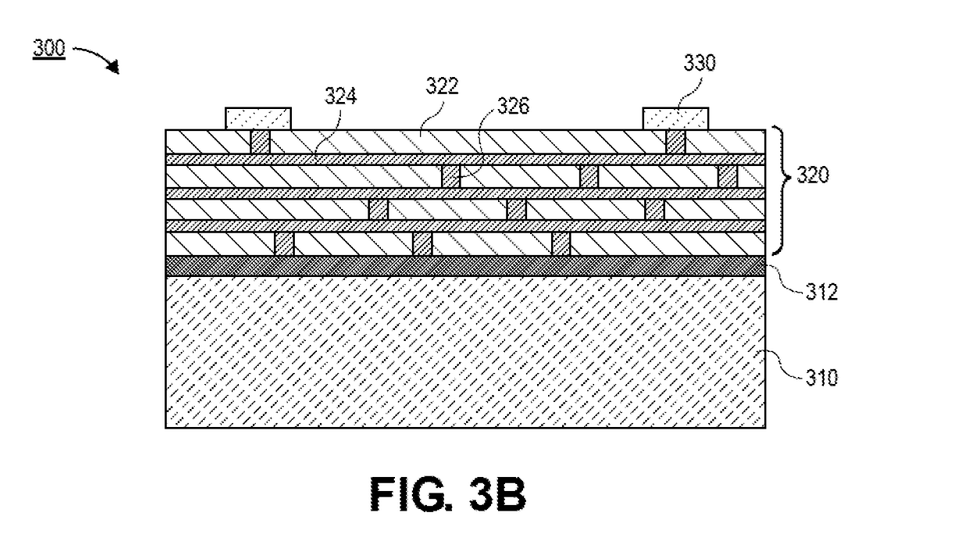
FIG. 3B is a cross-sectional illustration of the semiconductor die after interconnect layers are disposed over the active device layer, in accordance with an embodiment.

Referring now to FIG. 3B, a cross-sectional illustration of a semiconductor die 300 after first interconnect layers 320 are disposed over the active device layer 312 is shown, in accordance with an embodiment. In an embodiment, the first interconnect layers 320 may comprise ILD layers 322, conductive traces 324, and conductive vias 326. In some instances, the first interconnect layers 320 may be referred to as a back end of line (BEOL) stack. The first interconnect layers 320 may provide electrical coupling between the active device layer 312 and bumps 330 over the first interconnect layers 320. In an embodiment, the bumps 330 may be any interconnect architecture suitable for FLIs.

Figure 3C:
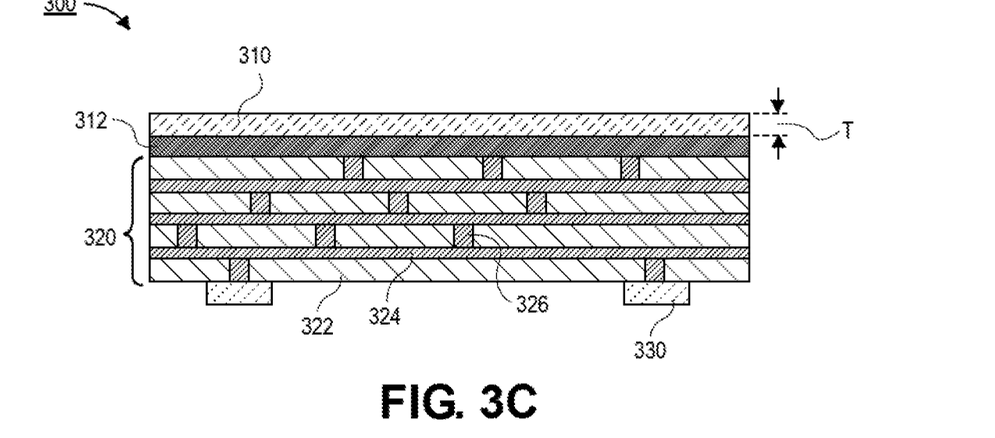
FIG. 3C is a cross-sectional illustration of the semiconductor die after the semiconductor substrate is thinned, in accordance with an embodiment.

Referring now to FIG. 3C, a cross-sectional illustration after the die 300 is flipped over and the semiconductor substrate 310 is recessed is shown, in accordance with an embodiment. In an embodiment, the bulk of the semiconductor substrate 310 is planarized with a grinding and/or polishing process (e.g., chemical mechanical planarization (CMP) or the like). In an embodiment, the residual portion of the semiconductor substrate 310 may have a thickness T between the active device layer 312 and the exposed surface of the semiconductor substrate 310. Reducing the thickness of the semiconductor substrate 310 reduces the thermal resistance of the semiconductor die 300 since the semiconductor substrate 310 has a relatively high thermal resistance compared to the thermal resistance of the subsequently attached heat spreader. The residual thickness of the substrate 310 protects the active device layer 312 and provides a location where the bonding layer attaches to the semiconductor substrate 310. Accordingly, the thickness T is minimized in accordance with various embodiments. In an embodiment, the thickness T may be less than approximately 10 μm. In other embodiments, the thickness T may be approximately 5 μm or less.

Figure 3D:
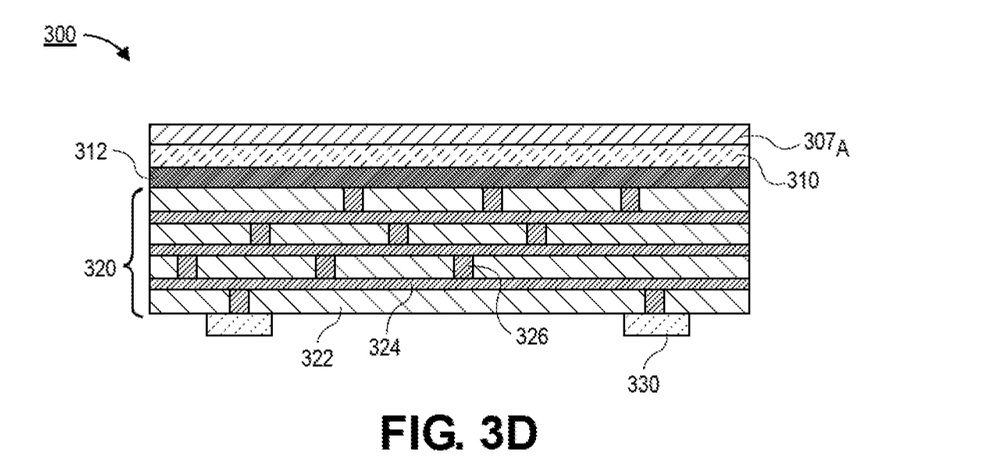
FIG. 3D is a cross-sectional illustration of the semiconductor die after a first bonding layer is disposed over the semiconductor substrate, in accordance with an embodiment.

Referring now to FIG. 3D, a cross-sectional illustration of the semiconductor die after a first bonding layer $307_A$ is disposed over the semiconductor substrate 310 is shown, in accordance with an embodiment. In an embodiment, the first bonding layer $307_A$ may be an oxide or a nitride. In a particular embodiment, the first bonding layer $307_A$ may comprise silicon and oxygen (e.g., $SiO_2$), silicon and nitrogen (e.g., SiN), or silicon, carbon, and nitrogen (SiCN). In an embodiment, the first bonding layer $307_A$ may be applied with any suitable process. For example, the first bonding layer $307_A$ may be applied with a physical vapor deposition (PVD), plasma enhanced chemical vapor deposition (PECVD), or the like.

Figure 3E:
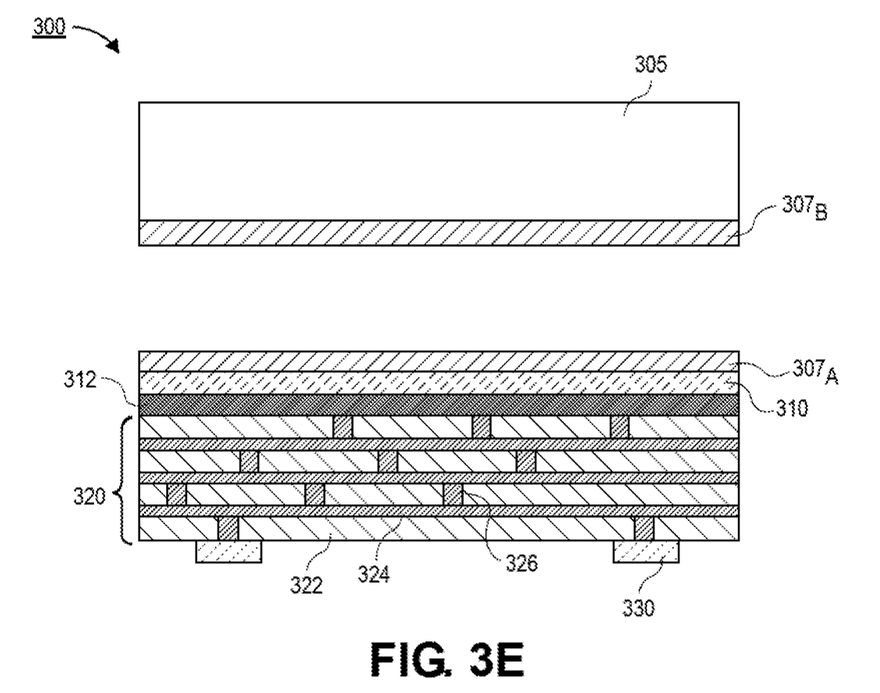
FIG. 3E is a cross-sectional illustration of the semiconductor die after an integrated heat spreader with a second bonding layer is positioned over the semiconductor die, in accordance with an embodiment.

Referring now to FIG. 3E, a cross-sectional illustration of the semiconductor die 300 after a heat spreader 305 with a second bonding layer $307_B$ is positioned over the semiconductor die 300 is shown, in accordance with an embodiment. In an embodiment, the heat spreader 305 is shown as a discrete component for simplicity. However, it is to be appreciated that the heat spreader 305 may be part of a wafer of the heat spreading material. Accordingly, there is no need for precise alignment of the heat spreader 305 to the die 300, since both may be singulated together. In an embodiment, the heat spreader 305 may comprise one or more of silicon and carbon (e.g., silicon carbide (SiC)), boron and arsenic (e.g., boron arsenide (BAs)), boron and phosphorous (e.g., boron phosphide (BP)), boron and nitrogen (e.g., boron nitride (BN)), and beryllium and oxygen (e.g., beryllium oxide (BeO)). In an embodiment, the heat spreader 305 may be polycrystalline or single crystalline.

In an embodiment, the second bonding layer $307_B$ may be substantially the same material composition as the first bonding layer $307_A$. The second bonding layer $307_B$ may be deposited over a surface of the heat spreader 305 with a PVD process, a PE-CVD process, or the like. In an embodiment, the first bonding layer $307_A$ and the second bonding layer $307_B$ may be polished to provide surfaces with improved flatness and lower roughness in order to improve bonding. For example, a CMP process may be used to planarize the first boding layer $307_A$ and the second bonding layer 307B.

Figure 3F:
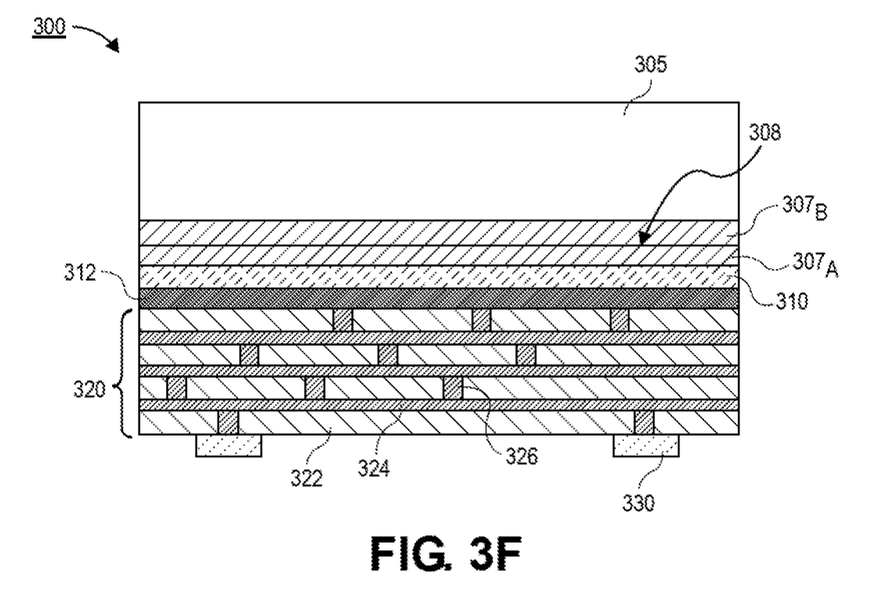
FIG. 3F is a cross-sectional illustration of the semiconductor die after the first and second bonding layers are secured to each other, in accordance with an embodiment.

Referring now to FIG. 3F, a cross-sectional illustration of the semiconductor die 300 after the heat spreader 305 is attached to the semiconductor die 300 is shown, in accordance with an embodiment. In an embodiment, the second bonding layer $307_B$ may be brought into contact with the first bonding layer $307_A$. In an embodiment, an annealing process may be used to bond the surfaces together. Pressure may also be applied to the heat spreader 305 in some embodiment. In other embodiments, a plasma activation bond may also be implemented. Such bonding processes are low temperature processes that do not negatively impact the semiconductor die 300. For example, the annealing temperature may be approximately 400° C. or less. As shown in FIG. 3F, the bonding of the first bonding layer $307_A$ to the second bonding layer $307_B$ may result in a seam 308 in the resulting semiconductor die 300. After bonding, the semiconductor die 300 may be singulated from the wafer using standard singulation processes. Since the heat spreader 305 is singulated with the same process as the singulation of the remainder of the semiconductor die 300, sidewalls of the heat spreader 305 may be substantially coplanar with sidewall surfaces of the semiconductor substrate 310.

Referring now to FIGS. 4A-4G, a series of cross-sectional illustrations depicting a process for fabricating a semiconductor die with an integrated heat spreader is shown, in accordance with an embodiment. In the illustrated embodiment, a single die 401 is illustrated. However, it is to be appreciated that the die 401 may be one die 401 in a wafer that comprises a plurality of dies 401 that are fabricated substantially in parallel.

Figure 4A:
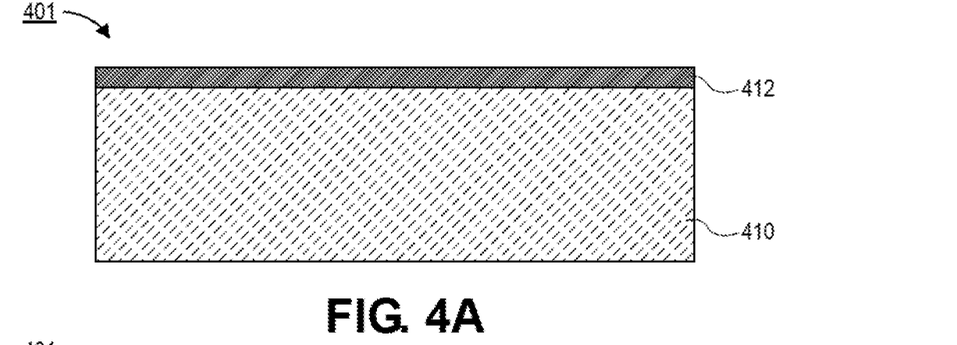
FIG. 4A is a cross-sectional illustration of a semiconductor die that comprises an active device layer, in accordance with an embodiment.

Referring now to FIG. 4A, a cross-sectional illustration of a semiconductor die 401 is shown, in accordance with an embodiment. In an embodiment, an active device layer 412 may be fabricated into the semiconductor substrate 410. In an embodiment, the active device layer 412 may comprise transistors or other active (or passive) components. For example, the active device layer 412 may include transistors for a processor die, a graphics processing die, a memory die, or any other type of die. The active device layer 412 may be fabricated with typical semiconductor fabrication processes, such as lithography, etching, doping, or the like.

Figure 4B:
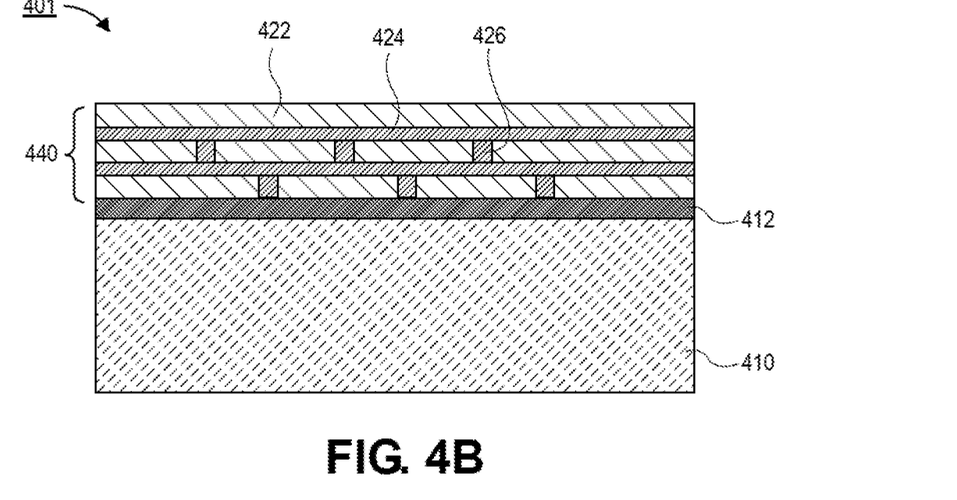
FIG. 4B is a cross-sectional illustration of the semiconductor die after first interconnect layers are disposed over a first surface of the active device layer, in accordance with an embodiment.

Referring now to FIG. 4B, a cross-sectional illustration of the semiconductor die 401 after first interconnect layers 440 are disposed over the active device layer 412 is shown, in accordance with an embodiment. In an embodiment, the first interconnect layers 440 may comprise ILD layers 422, conductive traces 424, and conductive vias 426. In some instances, the first interconnect layers 440 may be referred to as a BEOL stack. The first interconnect layers 440 may provide electrical coupling between the portions of the active device layer 412.

Figure 4C:
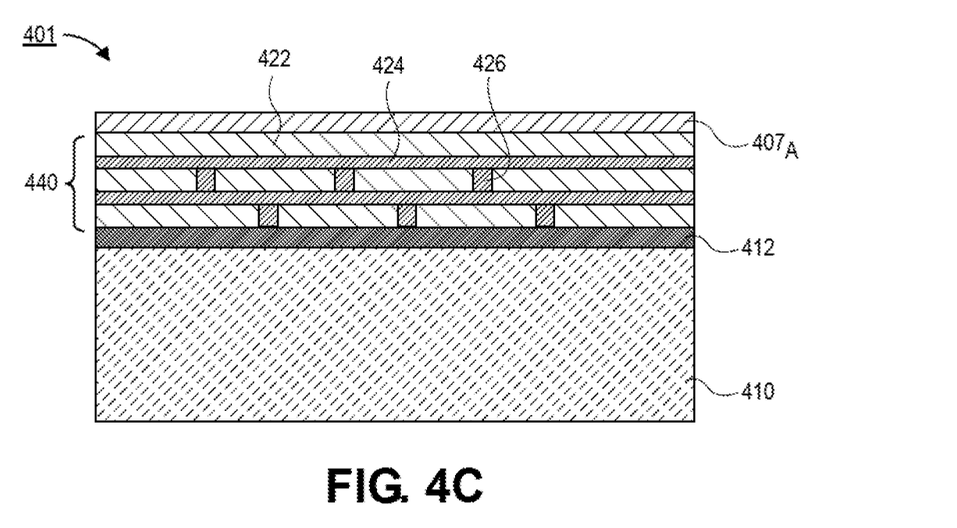
FIG. 4C is a cross-sectional illustration of the semiconductor die after a first bonding layer is disposed over the first interconnect layers, in accordance with an embodiment.

Referring now to FIG. 4C, a cross-sectional illustration of the semiconductor die 401 after a first bonding layer $407_A$ is disposed over the first interconnect layers 440 is shown, in accordance with an embodiment. In an embodiment, the first bonding layer $407_A$ may be an oxide or a nitride. In a particular embodiment, the first bonding layer $407_A$ may comprise silicon and oxygen (e.g., $SiO_2$), silicon and nitrogen (e.g., SiN), or silicon, carbon, and nitrogen (SiCN). In an embodiment, the first bonding layer $407_A$ may be applied with any suitable process. For example, the first bonding layer $407_A$ may be applied with a physical vapor deposition (PVD), plasma enhanced chemical vapor deposition (PE-CVD), or the like. In contrast to the embodiment described above with respect to FIGS. 3A-3F, the first bonding layer $407_A$ is disposed over the ILD layer 422 instead of being directly over the substrate 410.

Figure 4D:
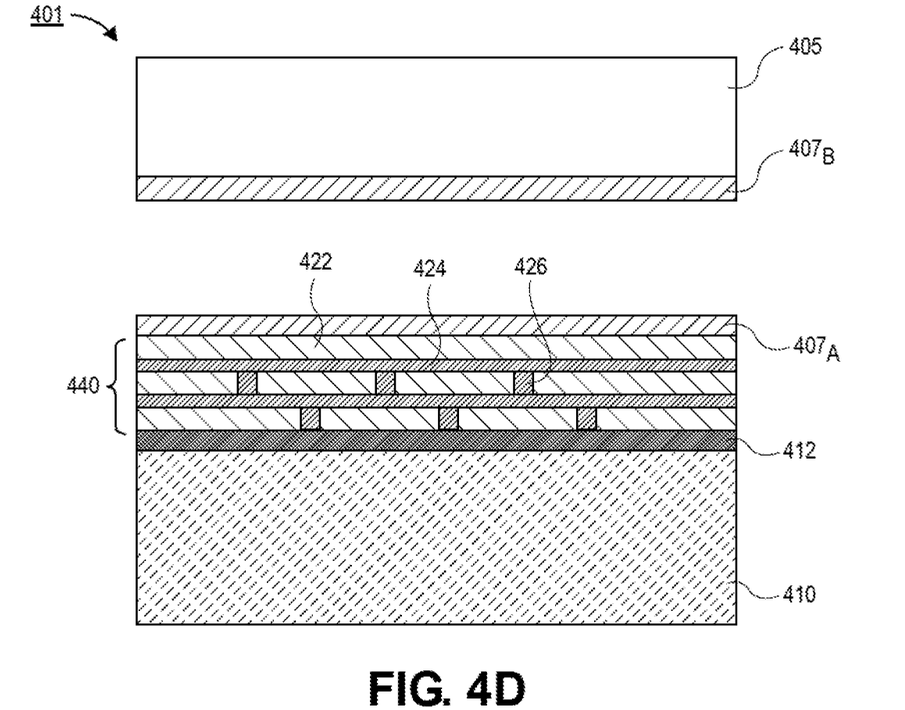
FIG. 4D is a cross-sectional illustration of the semiconductor die after an integrated heat spreader with a second bonding layer is positioned over the semiconductor die, in accordance with an embodiment.

Referring now to FIG. 4D, a cross-sectional illustration of the semiconductor die 401 after a heat spreader 405 with a second bonding layer 407B is positioned over the semiconductor die 401 is shown, in accordance with an embodiment. In an embodiment, the heat spreader 405 is shown as a discrete component for simplicity. However, it is to be appreciated that the heat spreader 405 may be part of a wafer of the heat spreading material. Accordingly, there is no need for precise alignment of the heat spreader 405 to the die 401, since both may be singulated together. In an embodiment, the heat spreader 405 may comprise one or more of silicon and carbon (e.g., silicon carbide (SiC)), boron and arsenic (e.g., boron arsenide (BAs)), boron and phosphorous (e.g., boron phosphide (BP)), boron and nitrogen (e.g., boron nitride (BN)), and beryllium and oxygen (e.g., beryllium oxide (BeO)). In an embodiment, the heat spreader 405 may be polycrystalline or single crystalline.

In an embodiment, the second bonding layer $407_B$ may be substantially the same material composition as the first bonding layer $407_A$. The second bonding layer $407_B$ may be deposited over a surface of the heat spreader 405 with a PVD process, a PE-CVD process, or the like. In an embodiment, the first bonding layer $407_A$ and the second bonding layer $407_B$ may be polished to provide surfaces with improved flatness and lower roughness in order to improve bonding. For example, a CMP process may be used to planarize the first bonding layer $407_A$ and the second bonding layer $407_B$.

Figure 4E:
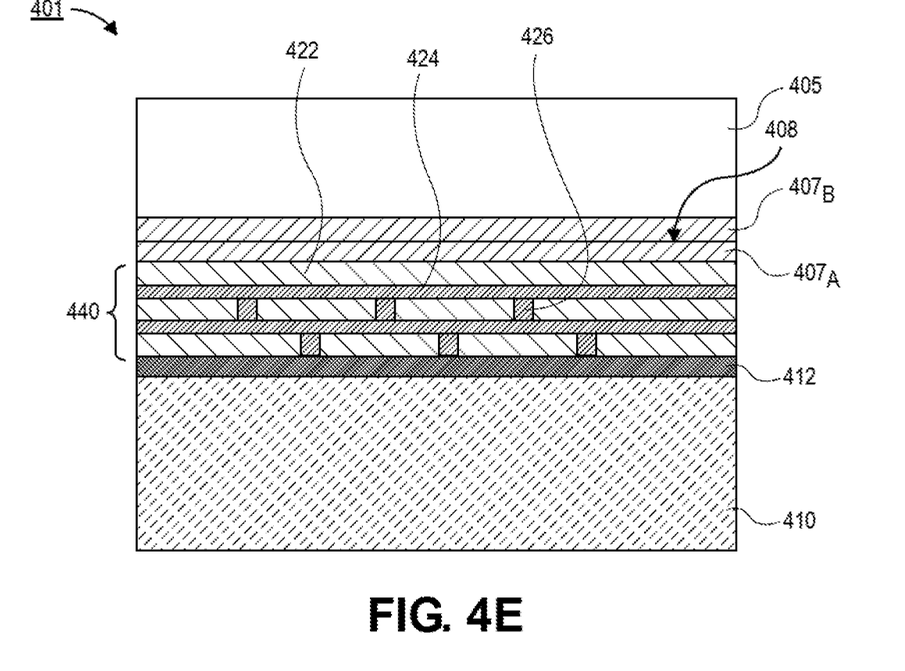
FIG. 4E is a cross-sectional illustration after the first and second bonding layers are secured to each other, in accordance with an embodiment.

Referring now to FIG. 4E, a cross-sectional illustration of the semiconductor die 401 after the heat spreader 405 is attached to the semiconductor die 401 is shown, in accordance with an embodiment. In an embodiment, the second bonding layer $407_B$ may be brought into contact with the first bonding layer $407_A$. In an embodiment, an annealing process may be used to bond the surfaces together. Pressure may also be applied to the heat spreader 405 in some embodiment. In other embodiments, a plasma activation bond may also be implemented. Such bonding processes are low temperature processes that do not negatively impact the semiconductor die 401. For example, the annealing temperature may be approximately 400° C. or less. As shown in FIG. 4E, the bonding of the first bonding layer $407_A$ to the second bonding layer $407_B$ may result in a seam 408 in the resulting semiconductor die 401.

Figure 4F:
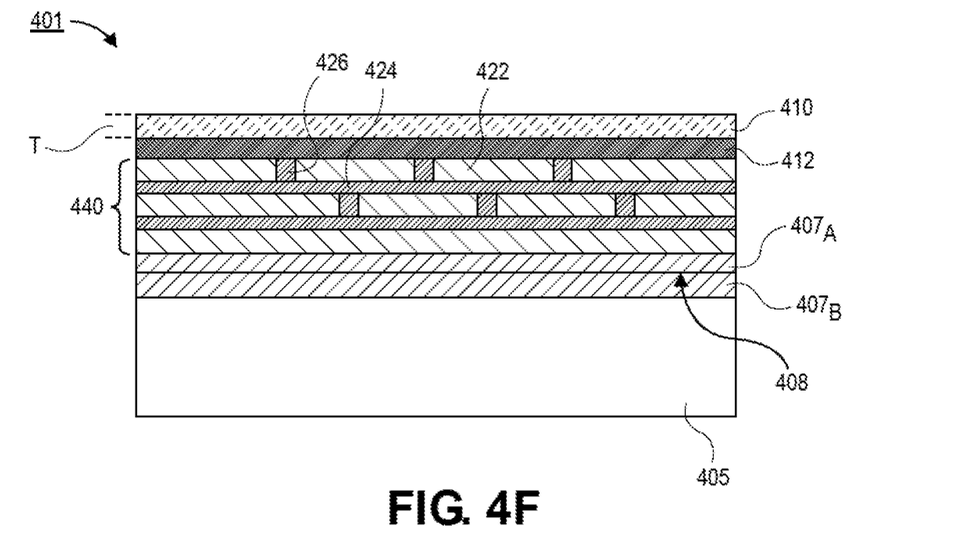
FIG. 4F is a cross-sectional illustration after the semiconductor substrate is thinned, in accordance with an embodiment.

Referring now to FIG. 4F, a cross-sectional illustration of the semiconductor die 401 after the semiconductor die 401 is flipped over and the substrate 410 is recessed is shown, in accordance with an embodiment. In an embodiment, the bulk of the semiconductor substrate 410 is planarized with a grinding and/or polishing process (e.g., CMP or the like). In an embodiment, the residual portion of the semiconductor substrate 410 may have a thickness T between the active device layer 412 and the exposed surface of the semiconductor substrate 410. In an embodiment, the thickness T may be less than approximately 10 μm. In other embodiments, the thickness T may be approximately 5 μm or less.

Figure 4G:
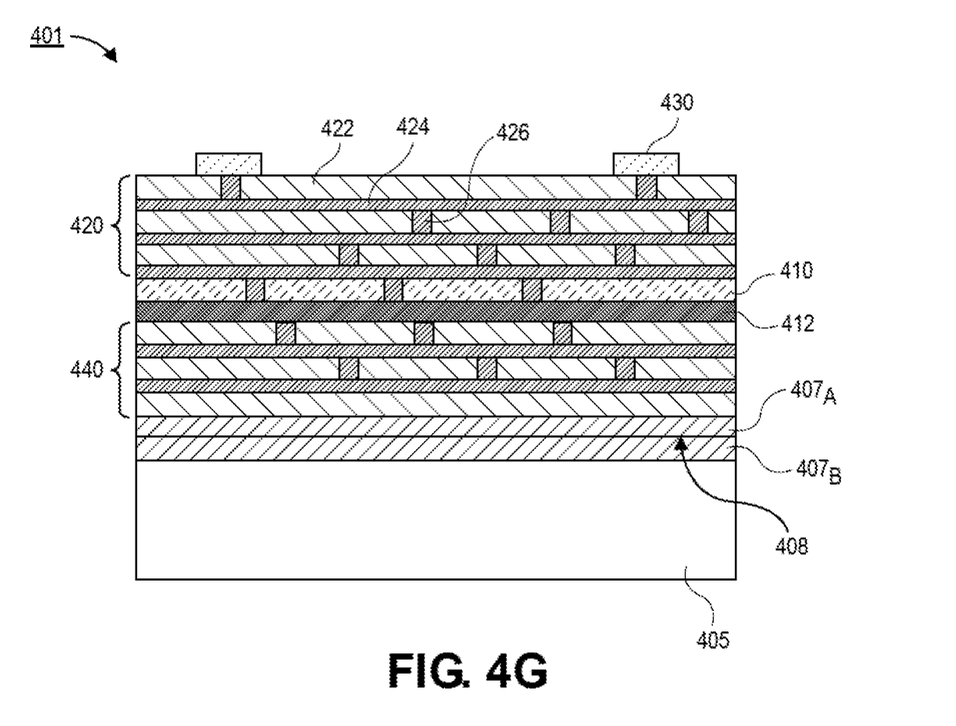
FIG. 4G is a cross-sectional illustration of the semiconductor substrate after second interconnect layers are disposed over a second surface of the active device layer, in accordance with an embodiment.

Referring now to FIG. 4G, a cross-sectional illustration of the semiconductor die 401 after second interconnect layers 420 are disposed over the semiconductor substrate 410 is shown, in accordance with an embodiment. In an embodiment, the second interconnect layers 420 may comprise ILD layers 422, conductive traces 424, and conductive vias 426. In some instances, the second interconnect layers 420 may be referred to as a BEOL stack. The second interconnect layers 420 may provide electrical coupling between the active device layer 412 and bumps 430 over the second interconnect layers 420. In an embodiment, the bumps 430 may be any interconnect architecture suitable for FLIs. As shown, the semiconductor die 401 includes interconnect layers 440 and 420 that are on opposite sides of the active device layer 412. In some embodiments, the first interconnect layers 440 may provide electrical routing between portions of the active device layer 412, and the second interconnect layers 420 may provide electrical routing to the bumps 430. After bonding, the semiconductor die 401 may be singulated from the wafer using standard singulation processes. Since the heat spreader 405 is singulated with the same process as the singulation of the remainder of the semiconductor die 401, sidewalls of the heat spreader 405 may be substantially coplanar with sidewall surfaces of the semiconductor substrate 410.

Figure 5:
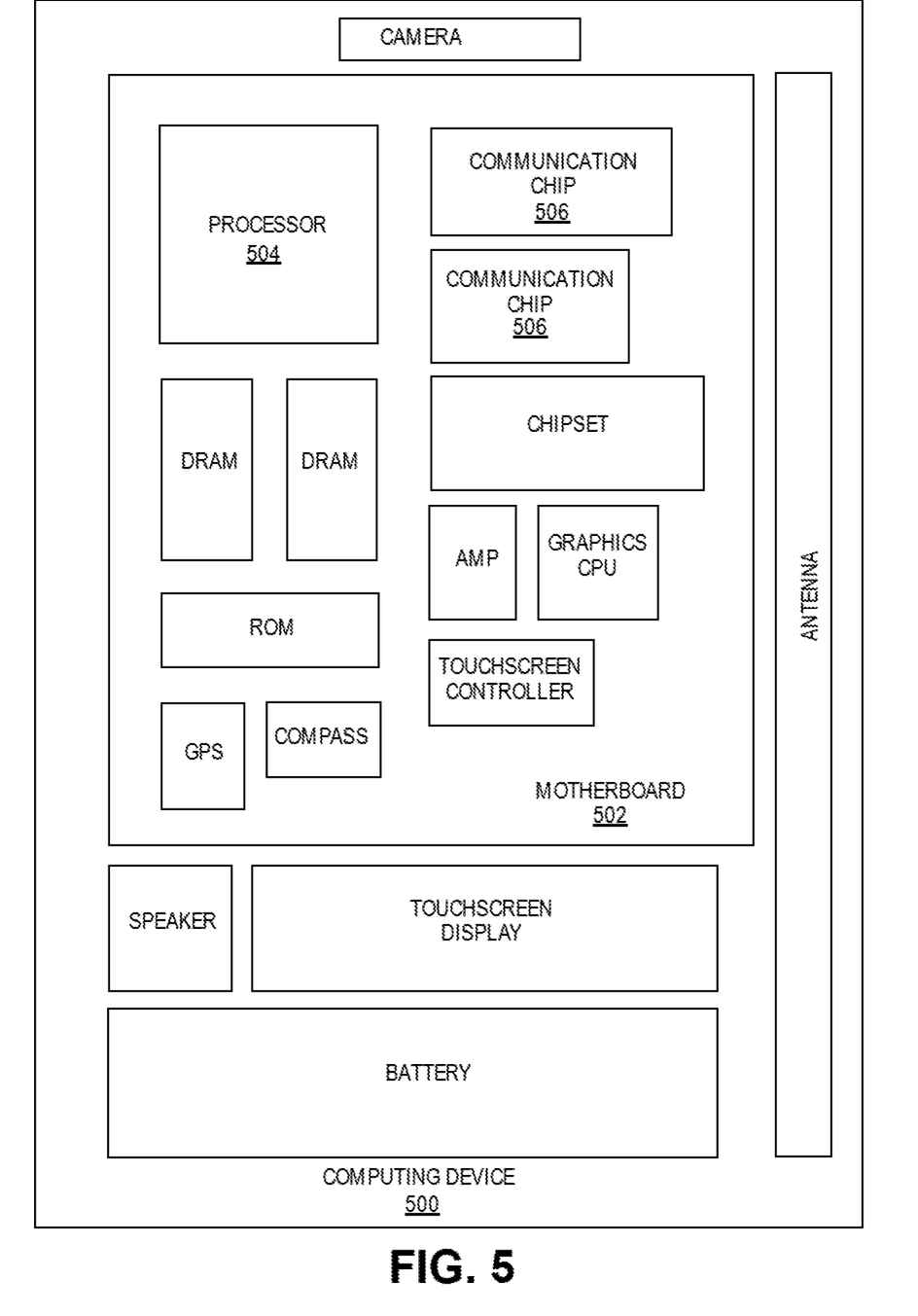
FIG. 5 is a schematic of a computing device built in accordance with an embodiment.

FIG. 5 illustrates a computing device 500 in accordance with one implementation of the invention. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some implementations of the invention, the integrated circuit die of the processor may include an integrated heat spreader, in accordance with embodiments described herein. The term "processor" may refer to any device or portion of a device that processes electronic data from registers and/or memory to transform that electronic data into other electronic data that may be stored in registers and/or memory.

The communication chip 506 also includes an integrated circuit die packaged within the communication chip 506. In accordance with another implementation of the invention, the integrated circuit die of the communication chip may include an integrated heat spreader, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: a semiconductor die, comprising: a semiconductor substrate; an active device layer in the semiconductor substrate, wherein the active device layer comprises one or more transistors; an interconnect layer over a first surface of the active device layer; a first bonding layer over a surface of the semiconductor substrate; a second bonding layer secured to the first bonding layer; and a heat spreader attached to the second bonding layer.

Example 2: the semiconductor die of Example 1, wherein a thermal conductivity of the heat spreader is greater than a thermal conductivity of the semiconductor substrate.

Example 3: the semiconductor die of Example 2, wherein the heat spreader comprises silicon and carbon.

Example 4: the semiconductor die of Example 3, wherein the heat spreader is single crystal silicon carbide (SiC) or polycrystalline SiC.

Example 5: the semiconductor die of Examples 1-4, wherein the heat spreader comprises one or more of boron and arsenic, boron and phosphorous, boron and nitrogen, and beryllium and oxygen.

Example 6: the semiconductor die of Examples 1-5, wherein the first bonding layer and the second bonding layer comprise the same material.

Example 7: the semiconductor die of Example 6, wherein the first bonding layer and the second bonding layer comprise silicon and oxygen.

Example 8: the semiconductor die of Example 6, wherein the first bonding layer and the second bonding layer comprise silicon and nitrogen.

Example 9: the semiconductor die of Example 6, wherein the first bonding layer and the second bonding layer comprise silicon, carbon, and nitrogen.

Example 10: the semiconductor die of Examples 1-9, further comprising a seam present at an interface between the first bonding layer and the second bonding layer.

Example 11: a semiconductor die, comprising: a semiconductor substrate; an active device layer in the semiconductor substrate, wherein the active device layer comprises one or more transistors; first interconnect layers over a first surface of the active device layer; second interconnect layers over a second surface of the active device layer; a first bonding layer over the second interconnect layers; a second bonding layer secured to the first bonding layer; and a heat spreader over the second bonding layer, wherein a thermal conductivity of the heat spreader is greater than a thermal conductivity of the semiconductor substrate.

Example 12: the semiconductor die of Example 11, wherein the heat spreader comprises one or more of silicon and carbon, boron and arsenic, boron and phosphorous, boron and nitrogen, and beryllium and oxygen.

Example 13: the semiconductor die of Example 12, wherein the heat spreader comprises a single crystalline crystal structure.

Example 14: the semiconductor die of Example 12, wherein the heat spreader comprises a polycrystalline crystal structure.

Example 15: the semiconductor die of Examples 11-14, wherein the first bonding layer and the second bonding layer comprise one or more of silicon and oxygen, silicon and nitrogen, and silicon, carbon, and nitrogen.

Example 16: a semiconductor die, comprising: a semiconductor substrate, wherein the semiconductor substrate comprises a first thermal conductivity; and a heat spreader attached to the semiconductor substrate, wherein the heat spreader comprises a second thermal conductivity that is less than the first thermal conductivity.

Example 17: the semiconductor die of Example 16, wherein the heat spreader is attached to the semiconductor substrate by a bonding layer.

Example 18: the semiconductor die of Example 17, wherein the bonding layer comprises one or more of silicon and oxygen, silicon and nitrogen, or silicon, carbon, and nitrogen.

Example 19: the semiconductor die of Example 17, wherein the bonding layer comprises a seam.

Example 20: the semiconductor die of Examples 16-19, wherein the heat spreader comprises one or more of silicon and carbon, boron and arsenic, boron and phosphorous, boron and nitrogen, and beryllium and oxygen.

Example 21: an electronic system, comprising: a semiconductor die, wherein the semiconductor die comprises: a semiconductor substrate; an active device layer in the semiconductor substrate; and a first heat spreader attached to the semiconductor substrate; a package substrate electrically coupled to the semiconductor die; a second heat spreader thermally coupled to the first heat spreader; a heat sink thermally coupled to the second heat spreader; and a board electrically coupled to the package substrate.

Example 22: the electronic system of Example 21, wherein the first heat spreader is attached to the semiconductor substrate by a bonding layer.

Example 23: the electronic system of Example 22, wherein the bonding layer comprises one or more of silicon and oxygen, silicon and nitrogen, and silicon, carbon, and nitrogen.

Example 24: the electronic system of Examples 21-23, wherein the first heat spreader comprises one or more of silicon and carbon, boron and arsenic, boron and phosphorous, boron and nitrogen, and beryllium and oxygen.

Example 25: the electronic system of Examples 21-24, wherein a thermal conductivity of the first heat spreader is greater than a thermal conductivity of the semiconductor substrate.

What is claimed is:

1. A semiconductor die, comprising:
    a semiconductor substrate having a footprint;
    an active device layer in the semiconductor substrate, wherein the active device layer comprises one or more transistors;
    an interconnect layer over a first surface of the active device layer, the interconnect layer entirely within the footprint of the semiconductor substrate;
    a first bonding layer over a surface of the semiconductor substrate;
    a second bonding layer secured to the first bonding layer; and
    a heat spreader attached to the second bonding layer.

2. The semiconductor die of claim 1, wherein a thermal conductivity of the heat spreader is greater than a thermal conductivity of the semiconductor substrate.

3. The semiconductor die of claim 2, wherein the heat spreader comprises silicon and carbon.

4. The semiconductor die of claim 3, wherein the heat spreader is single crystal silicon carbide (SiC) or polycrystalline SiC.

5. The semiconductor die of claim 1, wherein the heat spreader comprises one or more of boron and arsenic, boron and phosphorous, boron and nitrogen, and beryllium and oxygen.

6. The semiconductor die of claim 1, wherein the first bonding layer and the second bonding layer comprise the same material.

7. The semiconductor die of claim 6, wherein the first bonding layer and the second bonding layer comprise silicon and oxygen.

8. The semiconductor die of claim 6, wherein the first bonding layer and the second bonding layer comprise silicon and nitrogen.

9. The semiconductor die of claim 6, wherein the first bonding layer and the second bonding layer comprise silicon, carbon, and nitrogen.

10. The semiconductor die of claim 1, further comprising a seam present at an interface between the first bonding layer and the second bonding layer.

11. A semiconductor die, comprising:
    a semiconductor substrate having a footprint;
    an active device layer in the semiconductor substrate, wherein the active device layer comprises one or more transistors;
    first interconnect layers over a first surface of the active device layer, the first interconnect layers entirely within the footprint of the semiconductor substrate;
    second interconnect layers over a second surface of the active device layer;
    a first bonding layer over the second interconnect layers;
    a second bonding layer secured to the first bonding layer; and a heat spreader over the second bonding layer, wherein a thermal conductivity of the heat spreader is greater than a thermal conductivity of the semiconductor substrate.

12. The semiconductor die of claim 11, wherein the heat spreader comprises one or more of silicon and carbon, boron and arsenic, boron and phosphorous, boron and nitrogen, and beryllium and oxygen.

13. The semiconductor die of claim 12, wherein the heat spreader comprises a single crystalline crystal structure.

14. The semiconductor die of claim 12, wherein the heat spreader comprises a polycrystalline crystal structure.

15. The semiconductor die of claim 11, wherein the first bonding layer and the second bonding layer comprise one or more of silicon and oxygen, silicon and nitrogen, and silicon, carbon, and nitrogen.

16. A semiconductor die, comprising:
 a semiconductor substrate having a footprint, wherein the semiconductor substrate comprises a first thermal conductivity;
 an interconnect layer beneath the semiconductor substrate, the interconnect layer entirely within the footprint of the semiconductor substrate; and
 a heat spreader attached to the semiconductor substrate, wherein the heat spreader comprises a second thermal conductivity that is less than the first thermal conductivity.

17. The semiconductor die of claim 16, wherein the heat spreader is attached to the semiconductor substrate by a bonding layer.

18. The semiconductor die of claim 17, wherein the bonding layer comprises one or more of silicon and oxygen, silicon and nitrogen, or silicon, carbon, and nitrogen.

19. The semiconductor die of claim 17, wherein the bonding layer comprises a seam.

20. The semiconductor die of claim 16, wherein the heat spreader comprises one or more of silicon and carbon, boron and arsenic, boron and phosphorous, boron and nitrogen, and beryllium and oxygen.

21. An electronic system, comprising:
 a semiconductor die, wherein the semiconductor die comprises:
  a semiconductor substrate having a footprint;
  an active device layer in the semiconductor substrate;
  an interconnect layer beneath the active device layer, the interconnect layer entirely within the footprint of the semiconductor substrate; and
  a first heat spreader attached to the semiconductor substrate;
 a package substrate electrically coupled to the semiconductor die;
 a second heat spreader thermally coupled to the first heat spreader;
 a heat sink thermally coupled to the second heat spreader; and
 a board electrically coupled to the package substrate.

22. The electronic system of claim 21, wherein the first heat spreader is attached to the semiconductor substrate by a bonding layer.

23. The electronic system of claim 22, wherein the bonding layer comprises one or more of silicon and oxygen, silicon and nitrogen, and silicon, carbon, and nitrogen.

24. The electronic system of claim 21, wherein the first heat spreader comprises one or more of silicon and carbon, boron and arsenic, boron and phosphorous, boron and nitrogen, and beryllium and oxygen.

25. The electronic system of claim 21, wherein a thermal conductivity of the first heat spreader is greater than a thermal conductivity of the semiconductor substrate.

* * * * *